United States Patent
Matsudo

(10) Patent No.: US 10,184,786 B2
(45) Date of Patent: Jan. 22, 2019

(54) WEAR AMOUNT MEASURING APPARATUS AND METHOD, TEMPERATURE MEASURING APPARATUS AND METHOD AND SUBSTRATE PROCESSING SYSTEM

(71) Applicant: TOKYO ELECTRON LIMITED, Tokyo (JP)

(72) Inventor: Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 274 days.

(21) Appl. No.: 14/569,990

(22) Filed: Dec. 15, 2014

(65) Prior Publication Data

US 2015/0168130 A1 Jun. 18, 2015

(30) Foreign Application Priority Data

Dec. 16, 2013 (JP) ................. 2013-259228

(51) Int. Cl.
*H01J 37/32* (2006.01)
*G01B 11/06* (2006.01)
(Continued)

(52) U.S. Cl.
CPC ........ *G01B 11/0675* (2013.01); *G01B 9/0209* (2013.01); *G01B 9/02019* (2013.01); *G01B 9/02021* (2013.01); *G01B 9/02025* (2013.01); *G01B 9/02044* (2013.01); *G01K 5/48* (2013.01); *H01J 37/3288* (2013.01);
(Continued)

(58) Field of Classification Search
CPC G01B 11/06; G01B 9/02021; G01B 9/02019; G01B 9/02025; G01B 9/02044; G01B 9/0209; G01B 11/0675; G01K 11/32; G01K 5/48; H01J 37/32431;
(Continued)

(56) References Cited

U.S. PATENT DOCUMENTS

2011/0235056 A1* 9/2011 Matsudo ................ G01B 11/06
356/630
2012/0327394 A1* 12/2012 Matsudo ............... G01J 5/0007
356/43

FOREIGN PATENT DOCUMENTS

JP 2003050108 A * 2/2003
JP 2011-210853 A 10/2011
(Continued)

*Primary Examiner* — Yuechuan Yu
(74) *Attorney, Agent, or Firm* — Rothwell, Figg, Ernst & Manbeck, P.C.

(57) ABSTRACT

A wear amount measuring apparatus includes a light source, a light transmission unit, a first and a second irradiation unit, a spectroscope and an analysis unit. The light transmission unit splits a low-coherence light from the light source into a first and a second low-coherence light. The first and the second irradiation units irradiate the first and the second low-coherence light to the component to receive reflected lights from the component. The light transmission unit transmits the reflected lights received by the first irradiation unit and the second irradiation unit to the spectroscope. The spectroscope configured to detect intensity distribution of the reflected lights from the first and the second irradiation unit. The analysis unit calculates a thickness difference between a thickness of the component at the first measuring point and that at the second measuring point by performing Fourier transform on the intensity distribution.

5 Claims, 4 Drawing Sheets

(51) Int. Cl.
*G01K 5/48* (2006.01)
*G01B 9/02* (2006.01)
(52) U.S. Cl.
CPC .. *H01J 37/32449* (2013.01); *H01J 37/32522* (2013.01); *H01J 37/32642* (2013.01); *H01J 37/32724* (2013.01)
(58) Field of Classification Search
CPC ............ H01J 37/3288; H01J 37/32449; H01J 37/32522; H01J 37/32642; H01J 37/32724
See application file for complete search history.

(56) References Cited

FOREIGN PATENT DOCUMENTS

| | | | |
|---|---|---|---|
| JP | 2013-29487 A | | 2/2013 |
| JP | 2013117507 A | * | 6/2013 |

* cited by examiner

WEAR AMOUNT MEASURING APPARATUS AND METHOD, TEMPERATURE MEASURING APPARATUS AND METHOD AND SUBSTRATE PROCESSING SYSTEM

CROSS-REFERENCE TO RELATED APPLICATIONS

This application claims priority to Japanese Patent Application No. 2013-259228 filed on Dec. 16, 2013, the entire content of which is incorporated herein by reference.

FIELD OF THE INVENTION

The present invention relates to an apparatus and a method for measuring a wear amount of a component or a wear amount difference in a component by utilizing optical interference, an apparatus and a method for measuring a temperature of a component by utilizing optical interference, and a substrate processing system which applies the wear amount measuring apparatus or the temperature measuring apparatus to a substrate processing apparatus.

BACKGROUND OF THE INVENTION

In a substrate processing apparatus for performing plasma etching or the like on a semiconductor wafer, components made of various materials are provided in a processing chamber where the semiconductor wafer is accommodated. Among the components, a focus ring or an electrode plate forming a shower head is worn by a plasma. Therefore, there are suggested various techniques that measure a wear amount of a component to check replacement timing of the worn component.

For example, a reference piece having a known thickness is thermally coupled to an unused focus ring having a known thickness by a structure that is not substantially worn by a plasma. Then, the focus ring is installed at the substrate processing apparatus. Low-coherence light is irradiated to the focus ring from a bottom surface side of a wear amount measurement target position (hereinafter, referred to as "measuring position") of the focus ring and also irradiated to a reference mirror and the reference piece. Thereafter, there is measured an interference waveform between reflected light from the reference mirror in the case of moving the reference mirror in a direction parallel to an incidence direction of the low-coherence light, reflected lights from a top surface as a wear surface and a bottom surface of the focus ring, reflected light from the reference mirror, and reflected lights from a top surface and a bottom surface of the reference piece.

A thickness of the reference piece can be obtained from the interference waveform between the reflected light from the reference piece and the reflected light from the reference mirror and the moving distance of the reference mirror. A thickness at the measuring position of the focus ring can be obtained from the interference waveform between the reflected light from the focus ring and the reflected light from the reference mirror and the moving distance of the reference mirror. A thickness of the focus ring can be obtained from a ratio between the measured thicknesses and the known thickness of the reference piece (see, e.g. Japanese Patent Application Publication No. 2011-210853).

However, the method disclosed in Japanese Patent Application Publication No. 2011-210853 is disadvantageous in that the cost of the focus ring is increased because the reference piece needs to be coupled to the focus ring and also in that the measurement time is increased because the reference mirror needs to be moved.

To that end, there is suggested a method that measures a thickness of a component to measure a temperature of the component by using a optical frequency domain spectral interferometer (see, e.g., Japanese Patent Application Publication No. 2013-029487). In the method disclosed in Japanese Patent Application Publication No. 2013-029487, a thickness of the component at an irradiation position is measured by performing Fourier transform on spectrum distribution of reflected light from a top surface of the component and reflected light from a bottom surface of the component in the case of irradiating low-coherence light to a predetermined position of the component.

In the method disclosed in Japanese Patent Application Publication No. 2013-029487, a temperature of the component is measured by using previously obtained data on relationship between a temperature and a thickness of the component without measuring a wear amount of the component. However, in the case of measuring a thickness of a component by using the method disclosed in Japanese Patent Application Publication No. 2013-029487, a measurable thickness is determined by resolution of a spectroscope for detecting reflected light. For example, if a central wavelength is denoted by $\lambda_0$; a wavelength band is denoted by $\Delta w$; and the number of photodetectors of the spectroscope (the number of CCD devices) is denoted by N, the relationship between the parameters and a maximum measurable thickness x is expressed by the following equation 1.

$$x < \frac{\lambda_0^2}{2(\Delta\omega/N)} \qquad \text{Eq. 1}$$

For example, when $\lambda_0=1550$ nm, $\Delta w=40$ nm and $N=512$, x becomes 15.38 mm. When the component is made of Si, a maximum measurable thickness $x_0$ may be calculated by dividing x by 2n (n being a refractive index (about 3.65)). Therefore, $x_0=x/2n \fallingdotseq 2.1$ (mm) is obtained. In other words, if the component made of Si has a thickness greater than about 2.1 mm, the thickness thereof cannot be measured by the method disclosed in Japanese Patent Application Publication No. 2013-029487. As a result, a wear amount of the component cannot be measured.

SUMMARY OF THE INVENTION

In view of the above, the present invention provides an apparatus and a method that can measure a wear amount of a component with a simple configuration using a optical frequency domain spectral interferometer even when a thickness of a component cannot be directly measured. Further, the present invention provides an apparatus and a method that measure a temperature of a component having a known stepped portion by utilizing the wear amount measuring apparatus and the wear amount measuring method. Moreover, the present invention provides a substrate processing system which applies the wear amount measuring apparatus and the temperature measuring apparatus to a substrate processing apparatus.

In accordance with an aspect of the present invention, there is provided a wear amount measuring apparatus for measuring a wear amount of a component having a first surface and a second surface at least a part of which is worn over time, the component being made of a material which allows low-coherence light to pass therethrough, the apparatus including: a light source configured to output a low-coherence light; a light transmission unit configured to split the low-coherence light from the light source into a first low-coherence light and a second low-coherence light; a first irradiation unit configured to irradiate the first low-coherence light received from the light transmission unit onto a first entrance point on the first surface to receive a reflected light from the first entrance point and a reflected light from a first measuring point on the second surface; a second irradiation unit configured to irradiate the second low-coherence light received from the light transmission unit onto a second entrance point on the first surface to receive a reflected light from the second entrance point and a reflected light from a second measuring point on the second surface, wherein the light transmission unit receives the reflected lights from the first irradiation unit and the second irradiation unit to transmit them; a spectroscope configured to detect intensity distribution of the reflected lights received from the transmission unit; and an analysis unit configured to calculate a thickness difference between a first thickness of the component at the first measuring point and a second thickness of the component at the second measuring point by performing Fourier transform on the intensity distribution detected by the spectroscope.

In accordance with another aspect of the present invention, there is provided a temperature measuring apparatus for measuring a temperature of a component having a first surface and a second surface, the component being made of a material which allows low-coherence light to pass therethrough, the component including the stepped portion having a first portion and a second portion whose thickness is smaller than a thickness of the first portion, the apparatus including: a light source configured to output a low-coherence light; a light transmission unit configured to split the low-coherence light from the light source into a first low-coherence light and a second low-coherence light; a first irradiation unit configured to irradiate the first low-coherence light received from the light transmission unit onto a first entrance point on the first surface to receive a reflected light from the first entrance point and a reflected light from a first measuring point on the second surface; a second irradiation unit configured to irradiate the second low-coherence light received from the light transmission unit onto a second entrance point on the first surface to receive a reflected light from the second entrance point and a reflected light from a second measuring point on the second surface, wherein the light transmission unit receives the reflected lights from the first irradiation unit and the second irradiation unit to transmit them; a spectroscope configured to detect intensity distribution of the reflected lights received from the transmission unit; and a storage unit that stores data representing relationship between a temperature of the component and a thickness difference between a first thickness of the component at the first measuring point and a second thickness of the component at the second measuring point; and an analysis unit configured to calculate the thickness difference by performing Fourier transform on the intensity distribution detected by the spectroscope and calculate a current temperature of the component based on the calculated thickness difference and the data stored in the storage unit, wherein the first entrance point and the first measuring point are set at the first portion, and the second entrance point and the second measuring point are set at the second portion.

In accordance with another aspect of the present invention, there is provided a wear amount measuring method for measuring a wear amount of a component having a first surface and a second surface at least a part of which is worn over time, the component being made of a material which allows low-coherence light to pass therethrough, the method including: splitting a low-coherence light from a light source into a first low-coherence light and a second low-coherence light; irradiating the first low-coherence light onto a first entrance point on the first surface to receive a reflected light from the first entrance point and a reflected light from a first measuring point on the second surface; irradiating the second low-coherence light onto a second entrance point on the first surface to receive a reflected light from the second entrance point and a reflected light from a second measuring point on the second surface; detecting wavelength-dependent intensity distribution of a combined reflected light containing the reflected lights from the first entrance point, the first measuring point, the second entrance point and the second measuring point; and calculating a thickness difference between a first thickness of the component at the first measuring point and a second thickness of the component at the second measuring point by performing Fourier transform on the intensity distribution.

In accordance with another aspect of the present invention, there is provided a temperature measuring method for measuring a temperature of a component having a first surface and a second surface, the component being made of a material which allows low-coherence light to pass therethrough, wherein a stepped portion is formed at a part of the component, the component including the stepped portion having a first portion and a second portion whose thickness is smaller than a thickness of the first portion, the method including: providing data representing relationship between a temperature of the component and a thickness difference between thicknesses of the component at two points; splitting a low-coherence light from a light source into a first low-coherence light and a second low-coherence light; irradiating the first low-coherence light onto a first entrance point on the first surface to receive a reflected light from the first entrance point and a reflected light from a first measuring point on the second surface; irradiating the second low-coherence light onto a second entrance point on the first surface and to receive a reflected light from the second entrance point and a reflected light from a second measuring point on the second surface; detecting wavelength-dependent intensity distribution of a combined reflected light containing the reflected lights from the first entrance point, the first measuring point, the second entrance point and the second measuring point; and determining a thickness difference between a first thickness of the component at the first measuring point and a second thickness of the component at the second measuring point by performing Fourier transform on the intensity distribution; and calculating a current temperature of the component based on the determined thickness difference and the data, wherein the first entrance point and the first measuring point are set at the first portion, and the second entrance point and the second measuring point are set at the second portion.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings. Here, a substrate processing system which applies a wear amount measuring apparatus of the present invention to a substrate processing apparatus for performing plasma etching on a semiconductor wafer (hereinafter, referred to as "wafer") as a substrate will be described as an example.

Figure 1:
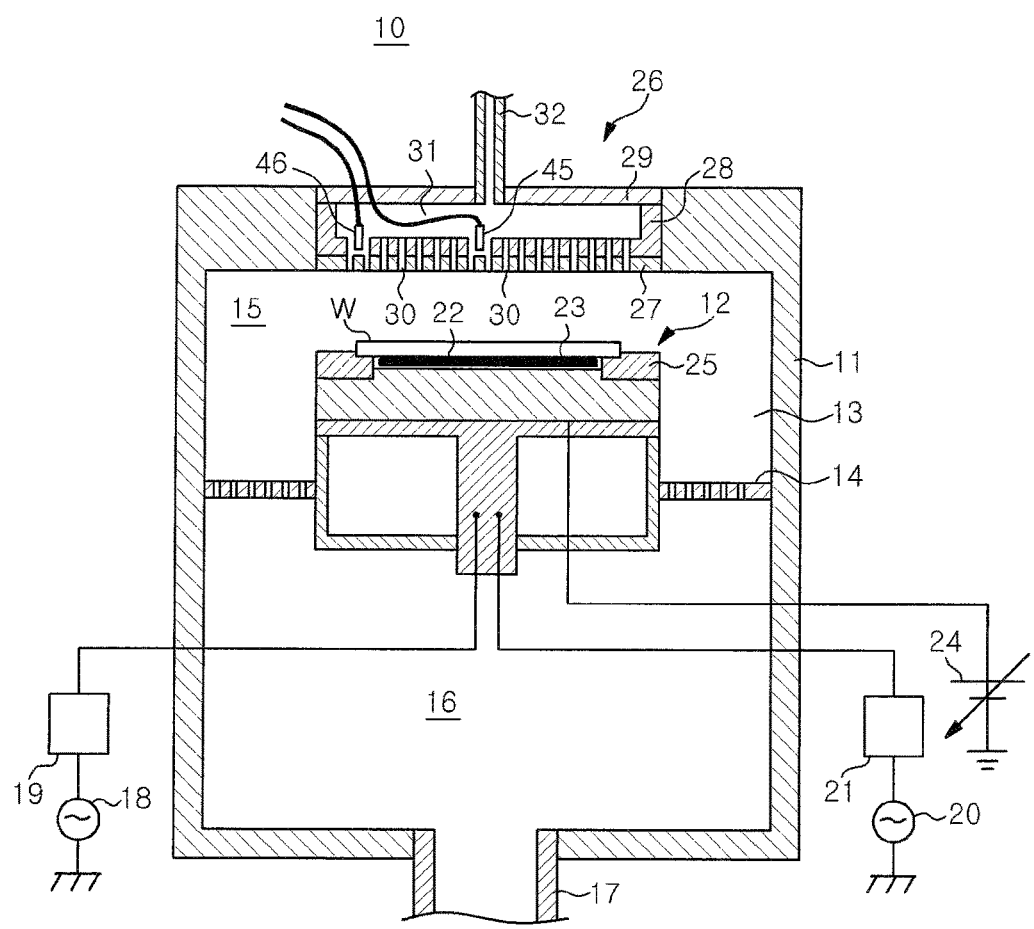
FIG. 1 is a cross sectional view showing a schematic configuration of a substrate processing apparatus to which a wear amount measuring apparatus in accordance with an embodiment of the present invention can be applied.

FIG. 1 is a cross sectional view showing a schematic configuration of a substrate processing apparatus 10 to which a wear amount measuring apparatus in accordance with an embodiment of the present invention can be applied. The substrate processing apparatus 10 shown in FIG. 1 includes a chamber 11 where a semiconductor device wafer having a diameter of, e.g., 300 mm, is accommodated. A cylindrical susceptor 12 (mounting table) for mounting thereon the wafer W is provided in the chamber 11. In the substrate processing apparatus 10, a side exhaust passageway 13 is formed between a side surface of the susceptor 12 and an inner wall of the chamber 11. A gas exhaust plate 14 is provided in the middle of the side exhaust passageway 13.

The gas exhaust plate 14 is a plate-shaped member having a plurality of through holes. The gas exhaust plate serves as a partition plate for partitioning the inner space of the chamber 11 into an upper portion and a lower portion. As will be described later, a plasma is generated in a processing chamber 15 defined at the upper portion of the chamber 11 by the gas exhaust plate 14. A gas exhaust line 17 through which gas in the chamber 11 is discharged is connected to a gas exhaust chamber (manifold) 16 defined at the lower portion of the chamber 11 by the gas exhaust plate 14. The gas exhaust plate 14 captures or reflects the plasma generated in the processing chamber 15 to prevent leakage of the plasma to the manifold 16.

A TMP (Turbo Molecular Pump) and a DP (Dry Pump) (both not shown) are connected to the gas exhaust line 17. The chamber 11 is evacuated and depressurized by those pumps. Specifically, the DP depressurizes in the inside of the chamber 11 from the atmospheric pressure to a medium vacuum state (e.g., about $1.3 \times 10$ Pa (0.1 Torr) or less) and the TMP depressurizes the inside of the chamber 11 to a high vacuum state (e.g., about $1.3 \times 10^{-3}$ Pa ($1.0 \times 10^{-5}$ Torr) or less) in cooperation with the DP. Further, the pressure in the chamber 11 is controlled by an APC valve (not shown).

The susceptor 12 is connected to a first high frequency power supply 18 via a first matching unit 19 and also connected to a second high frequency power supply 20 via a second matching unit 21. The first high frequency power supply 18 applies a high frequency power for ion attraction which has a relatively low frequency, e.g., 2 MHz, to the susceptor 12. Meanwhile, the second high frequency power supply 20 applies a high frequency power for plasma generation which has a relatively high frequency, e.g., 60 MHz, to the susceptor 12. Accordingly, the susceptor 12 serves as an electrode. Further, the first and the second matching unit 19 and 21 maximize the efficiency of applying the high frequency power to the susceptor 12 by reducing reflection of the high frequency power from the susceptor 12.

At the upper portion of the susceptor 12, a small-diameter cylinder protrudes coaxially from a top surface of a large-diameter cylinder, so that a stepped portion is formed so as to surround the small-diameter cylinder. An electrostatic chuck 23 made of ceramic and having therein an electrostatic electrode plate 22 is provided at a top surface of the small-diameter cylinder. A DC power supply is connected to the electrostatic electrode plate 22. When a positive DC voltage is applied to the electrostatic electrode plate 22, a negative potential is generated on a surface (backside) of the wafer W which faces the electrostatic chuck 23. Accordingly, a potential difference is generated between the electrostatic electrode plate 22 and the backside of the wafer W. The wafer W is attracted and held on the electrostatic chuck 23 by Coulomb force or Johnson Rahbeck force generated by the potential difference.

A focus ring 25 that is a ring-shaped member is mounted on the stepped portion formed at the upper portion of the susceptor 12 to surround the wafer W attracted and held on the electrostatic chuck 23. The focus ring 25 is made of, e.g., silicon. Since the focus ring is made of a semiconductor, the plasma distribution region is extended from a space above the wafer W to a space above the focus ring 25. Accordingly, the plasma density on the peripheral portion of the wafer W is maintained at a level substantially equal to that on the central portion of the wafer W. As a result, the plasma etching can be uniformly performed on the entire surface of the wafer W.

A shower head 26 is provided at a ceiling portion of the chamber 11 so as to face the susceptor 12. The shower head 26 includes an upper electrode plate 27, a cooling plate 28 detachably holding the upper electrode 27, and a cover 29 covering the cooling plate 28. The upper electrode plate 27 is made of a semiconductor, e.g., Si, and is formed of a circular plate-shaped member having a plurality of gas holes 30 penetrating therethrough in a thickness direction thereof.

A buffer space 31 is provided in the cooling plate 28, and a processing gas inlet line 32 is connected to the buffer space 31. In the substrate processing apparatus 10, a processing gas supplied into the buffer space 31 from the processing gas inlet line 32 is introduced into the processing chamber 15 through the gas holes 30. The processing gas introduced into the processing chamber 15 is excited into a plasma by the high frequency power for plasma generation which is applied from the second high frequency power supply 20 to the processing chamber 15 via the susceptor 12. Ions in the plasma are attracted toward the wafer W by the high frequency power for ion attraction which is applied from the first high frequency power supply 18 to the susceptor 12. As a consequence, the plasma etching is performed on the wafer W.

In this case, the ions in the plasma reach and sputter the top surface of the focus ring 25 or the bottom surface of the upper electrode plate 27. As a result, the focus ring 25 or the upper electrode plate 27 is worn. For example, if the bottom surface of the upper electrode plate 27 is uniformly worn, the plasma can be uniformly generated. However, if the wear rate is different between the central portion and the peripheral portion of the bottom surface, the plasma is not uniformly generated and the wafer W may be non-uniformly processed.

Figure 2:
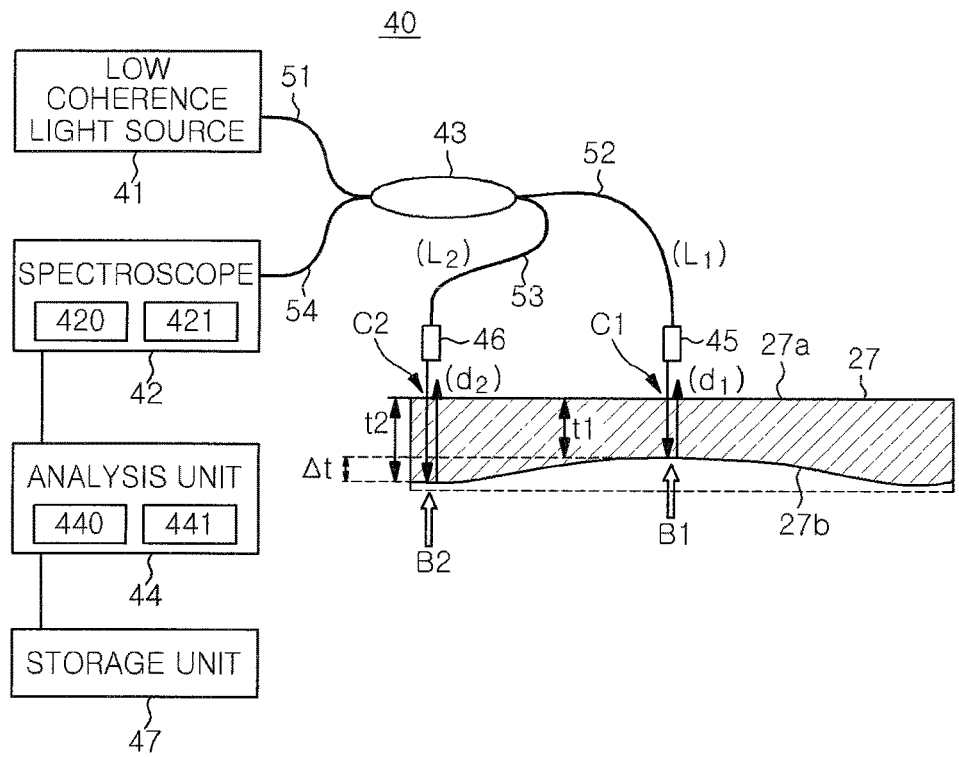
FIG. 2 is a block diagram showing a schematic configuration of the wear amount measuring apparatus of the substrate processing apparatus shown in FIG. 1.

Therefore, the substrate processing system includes the substrate processing apparatus 10 and the wear amount measuring apparatus for measuring the wear amount of the upper electrode plate 27. FIG. 2 is a block diagram showing a schematic configuration of the wear amount measuring apparatus applied to the substrate processing apparatus 10. In FIG. 2, the configuration for measuring the wear amount of the upper electrode plate 27 is illustrated. Further, in FIG. 2, the illustration of the gas holes 30 formed in the upper electrode plate 27 is omitted.

The wear amount measuring apparatus 40 includes a low-coherence light source 41, a spectroscope 42, a 2×2 coupler 43, an analysis unit 44, a first collimator 45, and a second collimator 46 (see FIG. 1). The low-coherence light source 41 and the 2×2 coupler 43 are connected to each other by a first optical fiber 51. The 2×2 coupler 43 and the first collimator 45 are connected to each other by a second optical fiber 52. The 2×2 coupler 43 and the second collimator 46 are connected to each other by a third optical fiber 53. The spectroscope 42 and the 2×2 coupler 43 are connected to each other by a fourth optical fiber 54.

As for the low-coherence light source 41, it is possible to use a SLD (Super Luminescent Diode) for outputting low-coherence light having a central wavelength $\lambda_0$ of 1.55 μm or 1.31 μm and a coherence length of 50 μm at a maximum output level of 1.5 mW.

The 2×2 coupler 43 and the first to the fourth optical fiber 51 to 54 constitute an optical transmission unit in the wear amount measuring apparatus 40. In other words, for example, the 2×2 coupler 43 splits the low-coherence light output from the low-coherence light source 41 into two paths to be transmitted to the first collimator 45 through the second optical fiber 52 and to the second collimator 46 through the third optical fiber 53.

Further, the 2×2 coupler 43 receives reflected light from the upper electrode plate 27 through the second optical fiber 52 in the case of irradiating the low-coherence light from the first collimator 45 to the upper electrode plate 27, receives reflected light from the upper electrode plate 27 through the third optical fiber 53 in the case of irradiating the low-coherence light from the second collimator 46 to the upper electrode plate 27, and transmits the received reflected light to the spectroscope 42 through the fourth optical fiber 54.

The first collimator 45 and the second collimator 46 have the same configuration and serve as irradiation units for irradiating low-coherence light to a top surface (upper surface) 27a of the upper electrode plate 27. Here, the first and the second collimator 45 and 46 are disposed at parts corresponding to parts of a bottom surface (lower surface) 27b of the upper electrode plate 27 having different wear rates. The arrangement positions of the first and the second collimator 45 and 46 are not limited to those shown in FIG. 1. For example, there may be employed a configuration in which the low-coherence light is irradiated from the first and the second collimator 45 and 46 to the upper electrode plate 27 through a window provided at the cover 29 from the top (outside) of the cover 29.

The first collimator 45 is disposed to face the top surface 27a of the upper electrode plate 27 at a position corresponding to an entrance point C1 and a measuring point B1 that are substantially at the central portion of the upper electrode plate 27. The low-coherence light adjusted as a parallel beam is irradiated to the entrance point C1 of the top surface 27a of the upper electrode plate 27 and the reflected lights from the entrance point C1 and the measuring point B1 of the upper electrode plate 27 are received. The received reflected lights are transmitted to the 2×2 coupler 43 through the second optical fiber 52.

The second collimator 46 is disposed to face the top surface 27a of the upper electrode plate 27 at a position corresponding to an entrance point C2 and a measuring point B2 that is near the periphery of the upper electrode plate 27. The low-coherence light adjusted as a parallel beam is irradiated to the entrance point C2 of the top surface 27a of the upper electrode plate 27 and the reflected lights from the entrance point C2 and the measuring point B2 of the upper electrode plate 27 are received. The received reflected lights are transmitted to the 2×2 coupler 43 through the third optical fiber 53.

The spectroscope 42 substantially includes a light dispersing device 420 and a light receiving device 421. The light dispersing device 420 disperses the reflected lights transmitted through the fourth optical fiber 54 at predetermined dispersion angles based on wavelengths (wavenumbers) of the reflected lights. The light dispersing device 420 may be, e.g., a diffraction grating. The light receiving device 421 receives the reflected lights dispersed by the light dispersing device 420 and detects spectrum distribution (intensity vs. wavenumber) of the received reflected lights. Specifically, a plurality of CCD devices arranged in a grid pattern is used as the light receiving device 421. The number of CCD devices is the number of sampling.

Since, the light receiving device 421 is a photoelectric conversion device such as a CCD device or the like as described above, a signal output from the spectroscope 42 to the analysis unit 44 is an analog electrical signal. Therefore, the analysis unit 44 includes an A/D converter and an operation unit such as a personal computer or the like. The A/D converter converts the analog signal output from the spectroscope 42 into a digital signal. The operation unit calculates an optical path difference to be described later and also calculates a wear amount difference Δt by performing Fourier transform of the digital signal from the A/D converter which shows the spectrum distribution. Further, the operation unit performs various operations such as Fourier transform and the like by allowing a CPU to execute predetermined software (program) stored in a ROM, a RAM, a hard disk drive or the like. Here, the Fourier transform is a process of converting a function of wavenumber (or frequency or wavelength) variables to a function of distance variables. The operation unit may comprise an optical path difference calculation unit 440 and a thickness difference calculation unit 441. The optical path difference calculation unit 440 is configured to calculate an optical path difference between the measuring points B1 and B2 by performing Fourier transform of the spectrum showing the intensity distribution of the reflected light detected by the spectroscope. The thickness difference calculation unit 441 is configured to calculate the thickness difference based on the optical path difference calculated by the optical path difference calculation unit 440 and a refractive index of the upper electrode plate 27.

As shown in FIG. 2, the bottom surface 27b of the upper electrode plate 27 which faces the wafer W is worn more at the central portion than at the peripheral portion due to different rates of wear caused by the plasma. In this case, it is considered that the top surface 27a at the entrance point C1 to which the low-coherence light from the first collimator 45 is irradiated and the bottom surface 27b at the measuring point B1 of the upper electrode plate 27 are substantially parallel to each other. In the same manner, it is considered that the top surface 27a at the entrance point C2 to which the low-coherence light from the second collimator 46 is irradiated and the bottom surface 27b at the measuring point B2 of the upper electrode plate 27 are substantially parallel to each other.

A wear amount difference $\Delta t$ is a difference between a thickness $t_1$ at the measuring point B1 and a thickness $t_2$ at the measuring point B2 of the upper electrode plate 27. Parameters for calculating the wear amount difference $\Delta t$ include:

$L_1$: distance from the 2×2 coupler 43 to the leading end of the first collimator 45;

$L_2$: distance from the 2×2 coupler 43 to the leading end of the second collimator 46;

$d_1$: distance from the leading end of the first collimator 45 to the top surface 27a (first measurement target surface) at the measuring point B1 of the upper electrode plate 27;

$d_2$: distance from the leading end of the second collimator 46 to the top surface 27a (second measurement target surface) at the measuring point B2 of the upper electrode plate 27;

$t_1$: thickness at the measuring point B1 of the upper electrode plate 27; and $t_2$: thickness at the measuring point B2 of the upper electrode plate 27.

Figure 3:
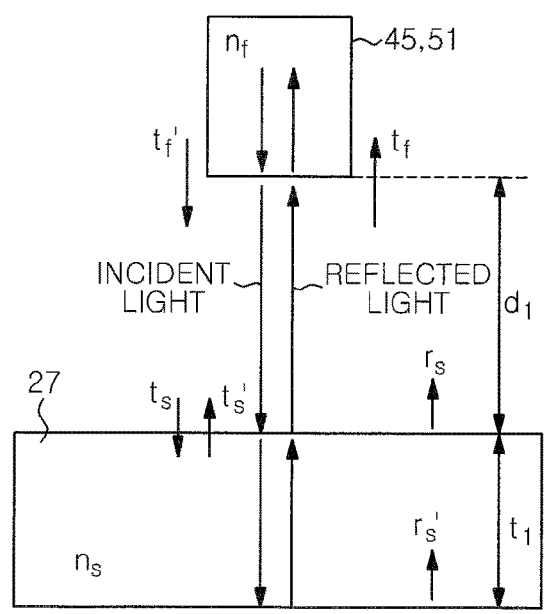
FIG. 3 explains various optical parameters used for calculating a wear amount of a component (upper electrode plate) by using the wear amount measuring apparatus shown in FIG. 2.

FIG. 3 explains various optical parameters used for calculating the wear amount difference $\Delta t$ of the upper electrode plate 27 in the wear amount measuring apparatus 40. The optical parameters shown in FIG. 3 include:

$n_s$: refractive index of the upper electrode plate 27 at a wavelength $\lambda$ (refractive index of Si);

$n_f$: refractive index of cores of the second and the third optical fibers 52 and 53 at a wavelength $\lambda$;

$t_f$: amplitude transmittance from an atmosphere to the second and the third optical fiber 52 and 53;

$t_f'$: amplitude transmittance from the second and the third optical fiber 52 and 53 to an atmosphere;

$t_s$: amplitude transmittance from an atmosphere to the upper electrode plate 27;

$t_s'$: amplitude transmittance from the upper electrode plate 27 to an atmosphere;

$r_s$: amplitude reflectance of light incident from an atmosphere to the upper electrode plate 27; and $r_s'$: amplitude reflectance of light incident from the upper electrode plate 27 to an atmosphere. Here, an atmosphere indicates a gas atmosphere or a vacuum atmosphere where the first and the second collimator 45 and 46 are disposed.

The interference of the reflected lights from the upper electrode plate 27 at the 2×2 coupler 43 is considered in order to split/combine the low-coherence light at the 2×2 coupler 43. An electric field $E_1$ of the low-coherence light on the optical path from the 2×2 coupler 43 to the first collimator 45 and an electric field $E_2$ of the low-coherence light on the optical path from the 2×2 coupler 43 to the second collimator 46 are expressed by the following equations 2 and 3, respectively. "$A_1$" and "$A_2$" in the following equations 2 and 3 represent the amplitudes of the electric fields of the low-coherence lights split by the 2×2 coupler 43 and "$k_0$" represents a wavenumber ($=2\pi/\lambda_0$) of the low-coherence light.

$$E_1 = t_f t_f' A_1 e^{i2n_f k_0 L_1} e^{i2k_0 d_1}(r_s + t_s t_s' r_s' e^{i2n_s k_0 t_1}) \quad \text{Eq. 2}$$

$$E_2 = t_f t_f' A_2 e^{i2n_f k_0 L_2} e^{i2k_0 d_2}(r_s + t_s t_s' r_s' e^{i2n_s k_0 t_2}) \quad \text{Eq. 3}$$

The interference of the lights is expressed by the following equation 4. The respective terms in the following equation 4 are expressed by the following equations 5 to 7.

$$|E_1 + E_2|^2 = |E_1|^2 + |E_2|^2 + E_1 * E_2 + E_2 * E_1 \quad \text{Eq. 4}$$

$$|E_1|^2 = n_f^2 t_f^4 r_s^2 A_1^2 \{1 - n_s^2 t_s^4 - 2n_s t_s^2 \cos(2n_s t_1 k_0)\} \quad \text{Eq. 5}$$

$$|E_2|^2 = n_f^2 t_f^4 r_s^2 A_2^2 \{1 - n_s^2 t_s^4 - 2n_s t_s^2 \cos(2n_s t_2 k_0)\} \quad \text{Eq. 6}$$

$$E_1 * E_2 + E_2 * E_1 = \quad \text{Eq. 7}$$
$$2n_f^2 t_f^4 r_s^2 A_1 A_2 \cos[2n_f(L_1 - L_2)k_0 + 2(d_1 - d_2)k_0] -$$
$$2n_f^2 t_f^4 n_s t_s^2 r_s^2 A_1 A_2 \cos[2n_f(L_1 - L_2)k_0 + 2(d_1 - d_2)k_0 + 2n_s t_1 k_0] -$$
$$2n_f^2 t_f^4 n_s t_s^2 r_s^2 A_1 A_2 \cos[2n_f(L_1 - L_2)k_0 + 2(d_1 - d_2)k_0 - 2n_s t_2 k_0] +$$
$$2n_f^2 t_f^4 n_s^2 t_s^4 r_s^2 A_1 A_2$$
$$\cos[2n_f(L_1 - L_2)k_0 + 2(d_1 - d_2)k_0 + 2n_s(t_1 - t_2)k_0]$$

Figure 4:
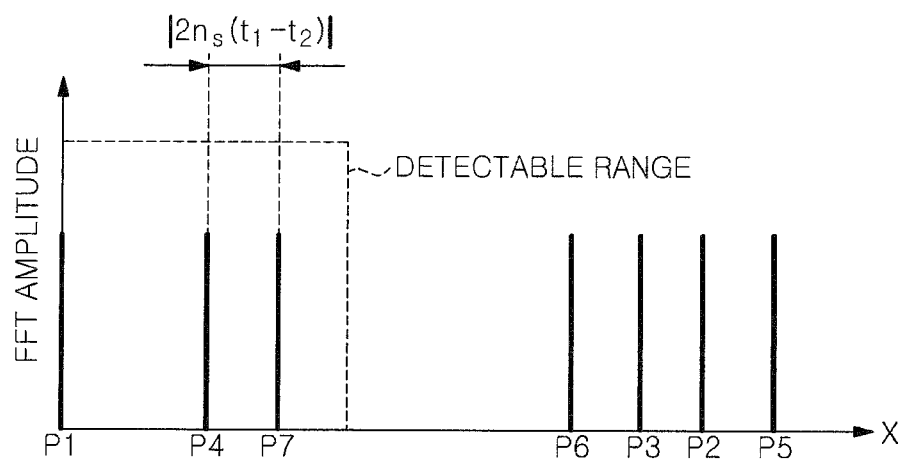
FIG. 4 schematically shows peak positions obtained by performing Fourier transform on spectrum of reflected light received by a spectrometer of the wear amount measuring apparatus shown in FIG. 2.

When the Fourier transform is performed on the signal expressed by the above equation 4, the following equations 8 to 14 can be obtained. P1 to P7 in the following equations 8 to 14 correspond to the peaks illustrated in FIG. 4. FIG. 4 schematically shows peak positions of the following equations 8 to 14. A range of a thickness that can be measured by the spectroscope 42 is denoted by "detectable range". In other words, as described in background of invention, if the central wavelength is denoted by $\lambda_0$; the wavelength band is denoted by $\Delta w$; and the number of detectors of the spectroscope (the number of CCD devices) is denoted by N, the relationship between the parameters and a maximum measurable thickness x is expressed by the above equation 1. A thickness of a silicon component which is greater than about 2 mm cannot be directly measured by the low-coherence light source 41 and the spectroscope 42. Hence, it is not possible to directly measure a thickness of the upper electrode plate 27 which is originally, e.g., about 10 mm.

$$x = 0, \quad \text{Eq. 8(P1)}$$

$$x = 2n_s t_1 \quad \text{Eq. 9(P2)}$$

$$x = 2n_s t_2 \quad \text{Eq. 10(P3)}$$

$$x = 2n_f(L_1 - L_2) + 2(d_1 - d_2) \quad \text{Eq. 11(P4)}$$

$$x = 2n_f(L_1 - L_2) + 2(d_1 - d_2) + 2n_s t_1 \quad \text{Eq. 12(P5)}$$

$$x = 2n_f(L_1 - L_2) + 2(d_1 - d_2) - 2n_s t_2 \quad \text{Eq. 13(P6)}$$

$$x = 2n_f(L_1 - L_2) + 2(d_1 - d_2) + 2n_s(t_1 - t_2) \quad \text{Eq. 14(P7)}$$

The replacement timing of the upper electrode plate 27 can be checked, without directly measuring the thickness of the upper electrode plate 27, by monitoring the movement of the peaks P4 and P7 in the equations 11 and 14 which show the wear amount difference between the two measuring points B1 and B2. This is because the plasma etching is affected by the wear amount distribution of the upper electrode plate 27.

As shown in the equations 11 and 14, the equation 14 is obtained by adding term "$t_1 - t_2 (=\Delta t)$" indicating the thickness difference between the two measuring points B1 and B2, i.e., the wear amount difference $\Delta t$, to the equation 11. When there is no thickness difference between the two measuring points B1 and B2 ($t_1 - t_2 = \Delta t = 0$), the equation 14 becomes equal to the equation 11 and, thus, the peaks P4 and P7 are overlapped. When a condition of "$t_1-t_2>0$" is satisfied, the peak P7 is positioned at a right side of the peak P4 (where the X-axis value becomes large). When a condition of "$t_1-t_2<0$" is satisfied, the peak P7 is positioned at a left side of the peak P4 (where the X-axis value becomes small).

Therefore, the wear amount difference Δt between the measuring points B1 and B2 can be measured by setting the optical system of the wear amount measuring apparatus 40 such that the peaks P4 and P7 are within a range that can be detected by the spectroscope 42. Further, as can be seen from the equation 14, the wear amount difference Δt between the measuring points B1 and B2 is obtained by dividing "$2n_s(t_1-t_2)$" indicating a distance between the peaks P4 and P7 by $2n_s$.

Especially, if a difference $L_1-L_2$ between the distances from the 2×2 coupler 43 to the first and the second collimators 45 and 46 and a difference d1-d2 between the distances from the first and the second collimators 45 and 46 to the top surface 27a of the upper electrode plate 27 are adjusted to be zero, the equation 14 indicates a shift amount from a point of x=0. Therefore, the upper electrode plate 27 can be replaced when the shift amount reaches a predetermined value.

Figure 5A:
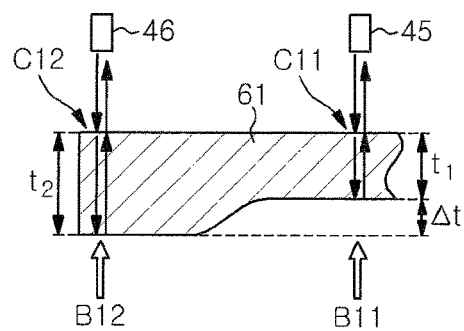
FIG. 5A schematically shows a shape of a component of which wear amount (absolute value) is measured by the wear amount measuring apparatus shown in FIG. 2, FIG. 5B schematically shows a shape of a component as a measurement target in the case of using the wear amount measuring apparatus as a temperature measuring apparatus, and FIG. 5C schematically shows relationship between a temperature of a component and a step difference of a stepped portion formed at the component.

FIG. 5A schematically shows a shape of a component of which wear amount (absolute value) is measured by the wear amount measuring apparatus 40. One measuring point B11 corresponding to an entrance point C11 to which the low-coherence light is irradiated is set at a part of the component 61 which is worn over time. The other measuring point B12 corresponding to an entrance point C12 is set at a part of the component 61 which is not worn over time.

The component 61 is originally a plate-shaped component having a uniform thickness $t_2$ (a top surface and a bottom surface being parallel to each other). Even if the component 61 is worn at the measuring point B11 and the thickness becomes $t_1$, the thickness $t_2$ at the measuring point B12 is not changed. In this case, "$2n_s(t_1-t_2)$" obtained by the equations 11 and 14 (relative positions of the peaks P4 and P7) indicates an optical path difference of the low-coherence light in the component 61 between an optical path extending from the entrance point C11 to the measuring point B11 and an optical path extending from the entrance point C12 to the measuring point B12. Since the component is not worn at the measuring point B12, the absolute value of the wear amount difference Δt(=$t_1-t_2$) indicates the absolute value of the wear amount at the measuring point B11.

Therefore, for example, when a wear amount (absolute value) of a specific portion, other than the wear amount difference between the two measuring pints, causes a problem in the plasma processing, the component 61 can be replaced when the wear amount (absolute value) reaches a predetermined value by using the above measuring method.

Figure 5B:
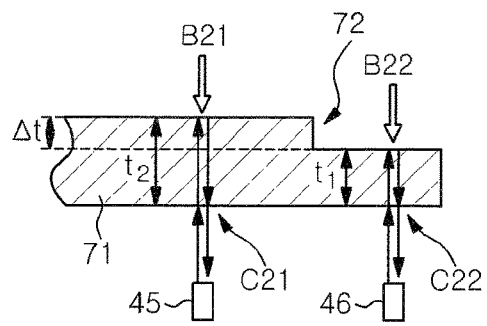

FIG. 5B schematically shows a shape of a component as a measurement target in the case of using the wear amount measuring apparatus 40 as the temperature measuring apparatus. The component 71 is originally a plate-shaped component having a uniform thickness $t_1$ (a top surface and a bottom surface being parallel to each other). However, a stepped portion 72 including a portion with a thickness $t_2$ is formed at a part of the component 71 in order to measure a temperature of the component 71.

It is assumed that the stepped portion 72 formed at the component 71 is not worn over time. Further, measuring points B21 and B22 to which the low-coherence lights are irradiated are set at parts of the stepped portion 72 of the component 71 which have different thicknesses. In this case, a thickness at the measuring point B21 of the component 71 and a thickness at the measuring point B22 of the component 71 are set to $t_1$ and $t_2$, respectively, to correspond to the parameters of the equation 14.

Figure 5C:
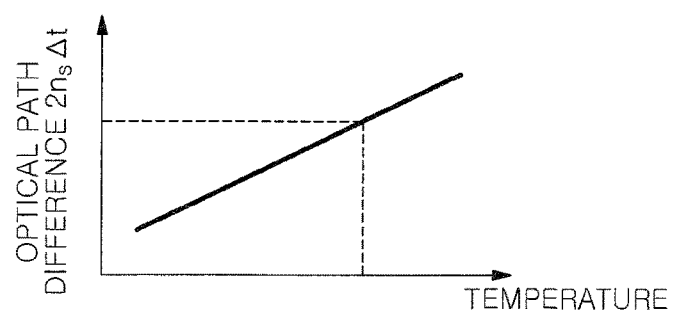

Meanwhile, a thickness difference Δt (=$t_1-t_2$) of the stepped portion 72 of the component 71 depends on a thermal expansion coefficient of a material forming the component 71 and thus is changed in accordance with a temperature. Therefore, the relationship (calibration data) between a temperature of the component 71 and the optical path difference $2n_s$Δt corresponding to the thickness difference Δt is obtained in advance by using a black body furnace or the like and stored in a storage unit 47, which may be a storage medium such as a ROM, a nonvolatile RAM, a hard disk drive or the like. The storage unit 47 may be disposed in the analysis unit 44. FIG. 5C schematically shows the relationship between a temperature of the component 71 and the optical path difference $2n_s$Δt corresponding to the thickness difference Δt.

Next, the optical path difference "$2n_s(t_1-t_2)$" between an optical path extending from an entrance point C21 to the measuring point B21 and an optical path extending from an entrance point C22 to the measuring point B22, corresponding to the thickness difference Δt(=$t_1-t_2$), is obtained based on the equations 11 and 14 (relative positions of the peaks P4 and P7) by the wear amount measuring apparatus 40. The optical path difference $2n_s(t_1-t_2)=2n_s$Δt thus obtained is checked with the calibration data shown in FIG. 5C which is stored in the storage unit 47. As a consequence, the temperature of the component 71 can be obtained. In addition, the temperature of the component 71 may be obtained from the calibration data on the relationship between a temperature of the component 71 and the thickness difference Δt which is previously obtained by using the black body furnace or the like and the thickness difference Δt calculated based on the refractive index $n_s$ of the component and the optical path difference $2n_s(t_1-t_2)$ measured by the wear amount measuring apparatus 40.

As described above, in accordance with the wear amount measuring apparatus 40, the low-coherence lights are irradiated to two entrance points of the component in the chamber 11 and the optical path difference in the component between an optical path extending from one entrance point to one measuring point corresponding thereto and an optical path extending from another entrance point to another measuring point corresponding thereto is obtained by using the reflected lights from the entrance points and the measuring points of the component. Accordingly, the thickness difference (wear amount difference) between the two measuring points can be obtained. In this case, since one of the two measuring points of the component is set at a part where a thickness is not changed and the other measuring point is set at a part where a thickness is reduced by wear or the like, the absolute value of the wear amount at the other measuring point can be obtained.

By using the wear amount measuring method, the wear amount of the component of which actual thickness cannot be measured at the two measuring points can be monitored. The processing can be stabilized by finely adjusting the absolute value of the wear amount or by finely adjusting the processing conditions in accordance with the absolute value. Further, the processing efficiency for the substrate can be maintained at a high level and, thus, the product quality can be maintained at a high level. In addition, since the component can be replaced at a proper timing, it is not necessary to take out the component from the chamber 11 and measure a wear amount thereof at a regular interval. Accordingly, the operational burden can be reduced, and the operating rate of the substrate processing apparatus 10 can be increased.

The wear amount measuring apparatus 40 can be used as the temperature measuring apparatus for measuring a temperature of a component by obtaining relationship between a temperature of the component and a thickness difference of a stepped portion formed at the component and measuring the step difference as the optical path difference between two measuring points of the stepped portion. Accordingly, a process is managed by monitoring the temperature of the component. Further, the process can be stabilized by finely controlling the processing conditions in accordance with the temperature of the component. Moreover, the processing efficiency for the substrate can be maintained at a high level and, thus, the product quality can be maintained at a high level.

While the embodiments of the present invention have been described, the present invention is not limited to the above embodiments. For example, in the above embodiments, the wear amount difference in the upper electrode plate 27 is measured by the wear amount measuring apparatus 40. However, the measurement target is not limited to the upper electrode plate 27. The present invention may be applied to any component as long as it is made of a material that transmits the low-coherence light. For example, a wear amount difference between an inner peripheral portion and an outer peripheral portion of the focus ring can be measured.

The wear amount measuring apparatus or the temperature measuring apparatus in accordance with the embodiment of the present invention may also be applied to a substrate processing apparatus for performing other vacuum processing without being limited to the substrate processing apparatus for performing plasma etching. Further, a substrate processed by the substrate processing apparatus is not limited to a wafer W and may also be a substrate other than a wafer W, e.g., a glass substrate for use in a FPD (Flat Panel Display) or a photomask, a CD substrate, a print substrate or the like.

While the invention has been shown and described with respect to the embodiments, it will be understood by those skilled in the art that various changes and modifications may be made without departing from the scope of the invention as defined in the following claims.

What is claimed is:

1. A wear amount measuring apparatus for measuring a wear amount of a component having a first surface and a second surface at least a part of which is worn over time, the component being made of a material which allows low-coherence light to pass therethrough, the apparatus comprising:
    a light source configured to output a low-coherence light;
    a light transmission unit configured to split the low-coherence light from the light source into a first low-coherence light and a second low-coherence light;
    a first irradiation unit configured to irradiate the first low-coherence light received from the light transmission unit onto a first entrance point on the first surface to receive a reflected light from the first entrance point and a reflected light from a first measuring point on the second surface, the first measuring point being set at a part of the component which is not worn over time;
    a second irradiation unit configured to irradiate the second low-coherence light received from the light transmission unit onto a second entrance point on the first surface to receive a reflected light from the second entrance point and a reflected light from a second measuring point on the second surface, the second measuring point being set at another part of the component other than the first measuring point and which is worn over time, wherein the light transmission unit receives the reflected lights from the first irradiation unit and the second irradiation unit to transmit them;
    a spectroscope configured to detect intensity distribution of the reflected lights received from the transmission unit; and
    an analysis unit configured to calculate a thickness difference between a first thickness of the component at the first measuring point and a second thickness of the component at the second measuring point by performing Fourier transform on the intensity distribution detected by the spectroscope,
    wherein the thickness difference between the first thickness and the second thickness is measured based on a distance between two peaks among a plurality of peaks obtained by performing the Fourier transform, and
    wherein the analysis unit is further configured to calculate an absolute value of a wear amount of the component at the second measuring point based on the thickness difference between the first thickness of the component at the first measuring point and the second thickness of the component at the second measuring point.

2. The wear amount measuring apparatus of claim 1, wherein the analysis unit includes:
    an optical path difference calculation unit configured to calculate an optical path difference between a first optical path extending from the first entrance point to the first measuring point and a second optical path extending from the second entrance point to the second measuring point by performing the Fourier transform on the intensity distribution detected by the spectroscope; and
    a thickness difference calculation unit configured to calculate the thickness difference based on the optical path difference and a refractive index of the component.

3. The wear amount measuring apparatus of claim 1, wherein the spectroscope includes:
    a light dispersing device configured to disperse the reflected lights at predetermined dispersion angles based on wavelengths of the reflected lights; and
    a light receiving device configured to receive the reflected lights dispersed by the light dispersing device and detect wavelength-dependent intensity distribution of the reflected lights.

4. A substrate processing system comprising:
    the wear amount measuring apparatus of claim 1 configured to measure a wear amount of the component; and
    a substrate processing apparatus including a chamber in which a mounting table for mounting thereon a substrate is provided, the chamber being configured to perform predetermined process on the substrate mounted on the mounting table, and the component disposed in the chamber.

5. The substrate processing system of claim 4, wherein the substrate processing apparatus is an apparatus for performing plasma etching on the substrate mounted on the mounting table, and
    wherein the component is an electrode plate disposed to face the substrate mounted on the mounting table with a predetermined gap therebetween.

* * * * *